(12) United States Patent
Duqi et al.

(10) Patent No.: US 10,407,301 B2
(45) Date of Patent: Sep. 10, 2019

(54) MEMS DEVICE INCLUDING A CAPACITIVE PRESSURE SENSOR AND MANUFACTURING PROCESS THEREOF

(71) Applicant: STMICROELECTRONICS S.R.L., Agrate Brianza (IT)

(72) Inventors: Enri Duqi, Milan (IT); Lorenzo Baldo, Bareggio (IT); Roberto Carminati, Piancogno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/870,429

(22) Filed: Jan. 12, 2018

(65) Prior Publication Data

US 2018/0282152 A1 Oct. 4, 2018

(30) Foreign Application Priority Data

Mar. 31, 2017 (IT) .......................... 102017000035969

(51) Int. Cl.
*B81B 3/00* (2006.01)
*B81C 1/00* (2006.01)
*B81B 7/02* (2006.01)

(52) U.S. Cl.
CPC .......... *B81C 1/00222* (2013.01); *B81B 7/02* (2013.01); *B81C 1/00261* (2013.01); *B81C 1/00349* (2013.01); *B81B 3/0021* (2013.01); *B81B 2201/0242* (2013.01); *B81B 2201/0264* (2013.01); *B81B 2207/097* (2013.01); *B81C 2201/01* (2013.01)

(58) Field of Classification Search
CPC ............ B81C 1/00222; B81C 1/00349; B81C 1/00261; B81C 2201/01; B81B 3/0021
USPC .......................................................... 257/415
See application file for complete search history.

(56) References Cited

U.S. PATENT DOCUMENTS

| | | | |
|---|---|---|---|
| 8,316,718 B2 * | 11/2012 | Lin ....................... | G01L 9/0073 438/50 |
| 2010/0052082 A1 * | 3/2010 | Lee ....................... | B81B 7/0061 257/416 |
| 2011/0126632 A1 * | 6/2011 | McNeil ................. | B81B 7/02 73/718 |
| 2012/0260747 A1 * | 10/2012 | Chen .................... | G01L 19/0092 73/863 |
| 2013/0001710 A1 * | 1/2013 | Daneman ............... | H01L 23/10 257/415 |

(Continued)

*Primary Examiner* — Karen Kusumakar
*Assistant Examiner* — Adam S Bowen
(74) *Attorney, Agent, or Firm* — Seed Intellectual Property Law Group LLP

(57) ABSTRACT

MEMS device, in which a body made of semiconductor material contains a chamber, and a first column inside the chamber. A cap of semiconductor material is attached to the body and forms a first membrane, a first cavity and a first channel. The chamber is closed on the side of the cap. The first membrane, the first cavity, the first channel and the first column form a capacitive pressure sensor structure. The first membrane is arranged between the first cavity and the second face, the first channel extends between the first cavity and the first face or between the first cavity and the second face and the first column extends towards the first membrane and forms, along with the first membrane, plates of a first capacitor element.

24 Claims, 11 Drawing Sheets

(56) References Cited

U.S. PATENT DOCUMENTS

| | | | |
|---|---|---|---|
| 2013/0221457 A1* | 8/2013 | Conti | B81B 7/0061 |
| | | | 257/416 |
| 2013/0283912 A1* | 10/2013 | Lin | G01P 15/0802 |
| | | | 73/514.16 |
| 2014/0338459 A1* | 11/2014 | Besling | G01L 9/0073 |
| | | | 73/718 |
| 2015/0001651 A1* | 1/2015 | Faralli | B81B 3/0021 |
| | | | 257/417 |
| 2015/0091153 A1* | 4/2015 | Liu | B81C 1/00293 |
| | | | 257/704 |
| 2015/0102434 A1* | 4/2015 | Maggi | B81C 1/00238 |
| | | | 257/415 |
| 2015/0166333 A1* | 6/2015 | Li | B81B 7/0058 |
| | | | 257/415 |
| 2015/0375995 A1* | 12/2015 | Steimle | B81C 1/00238 |
| | | | 257/418 |
| 2016/0244325 A1* | 8/2016 | Cheng | B81B 7/02 |
| 2016/0327446 A1* | 11/2016 | Classen | G01L 9/0073 |
| 2017/0210618 A1* | 7/2017 | Chang | B81C 1/00158 |

* cited by examiner

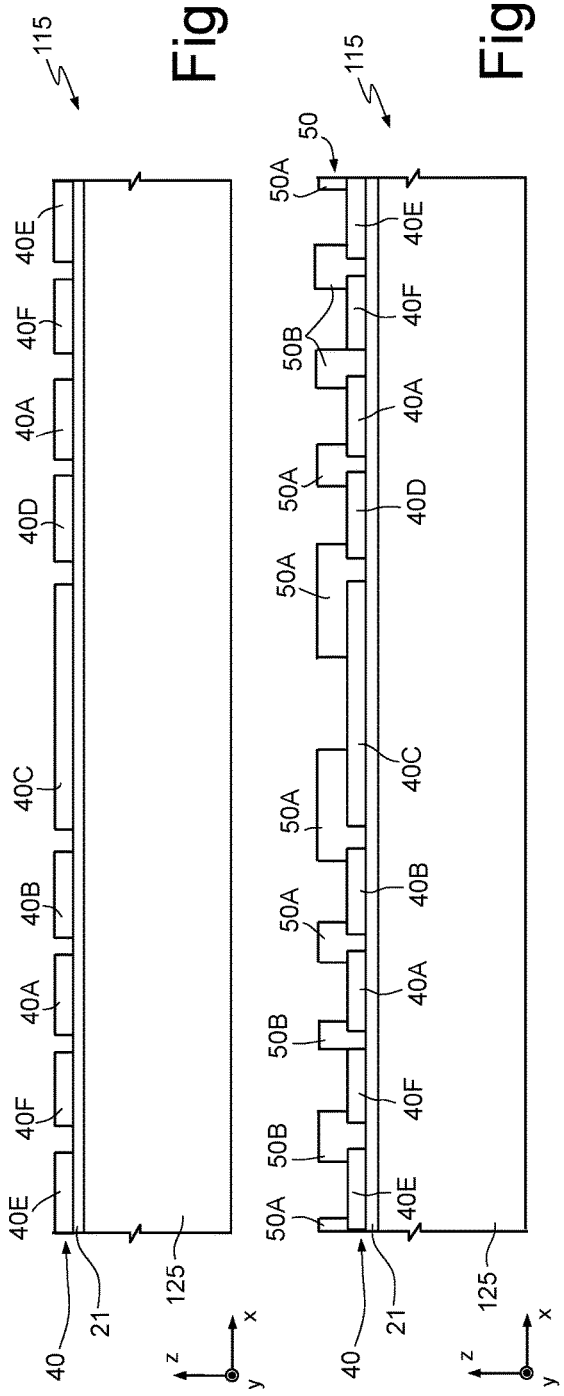

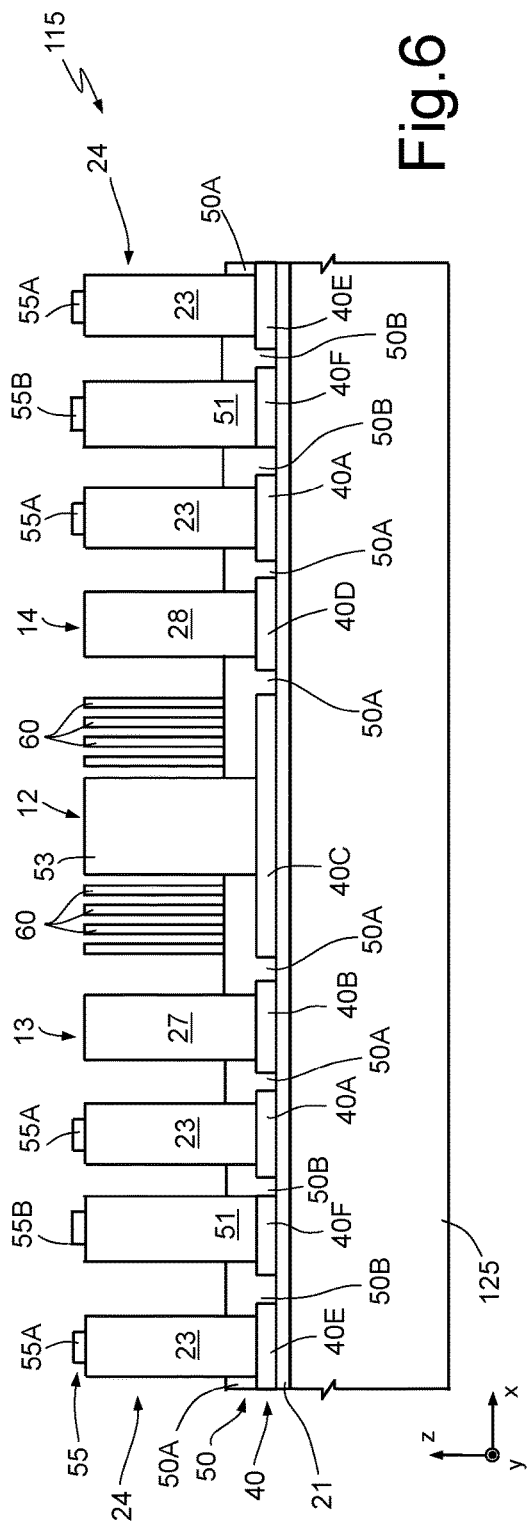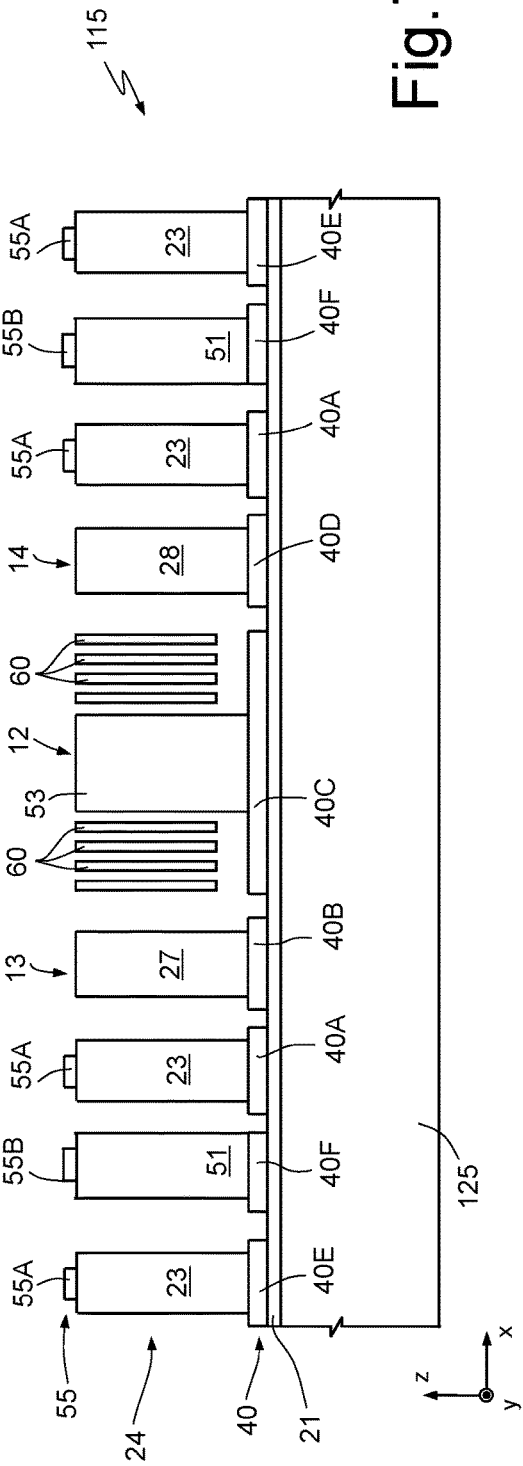

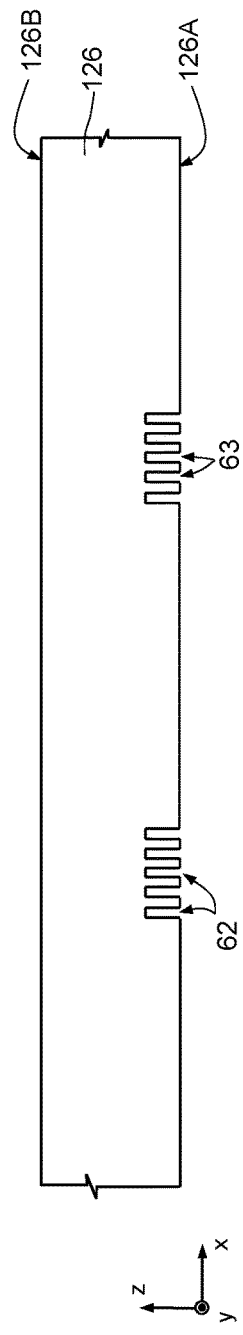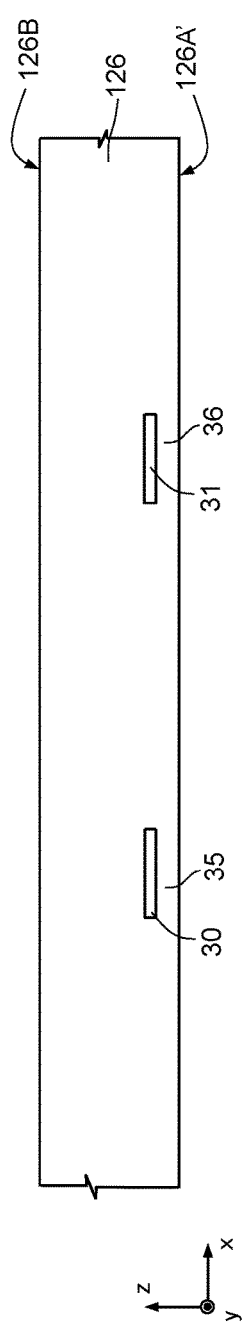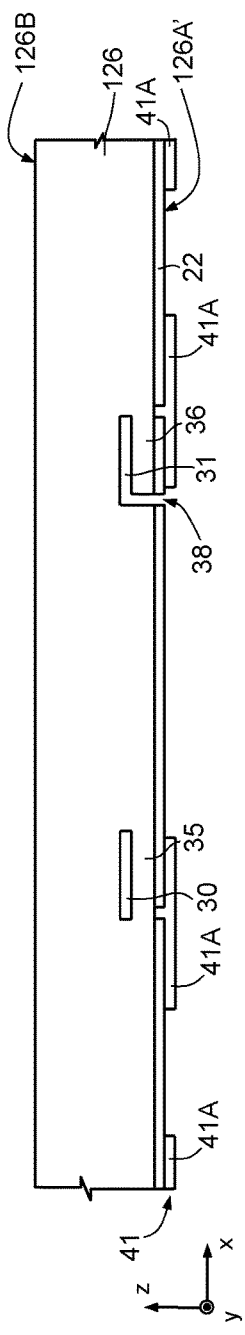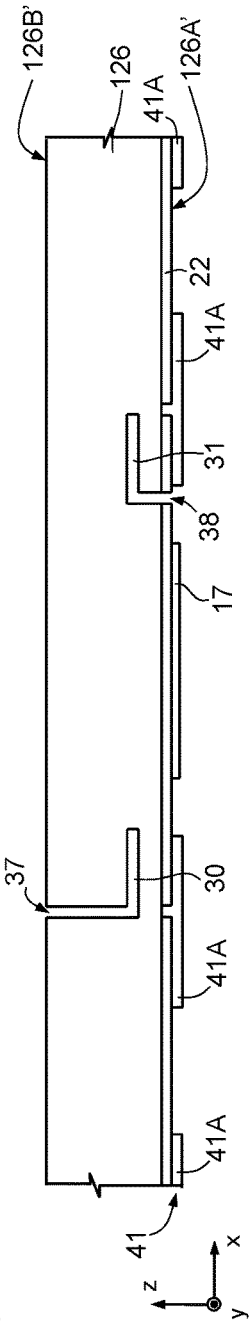

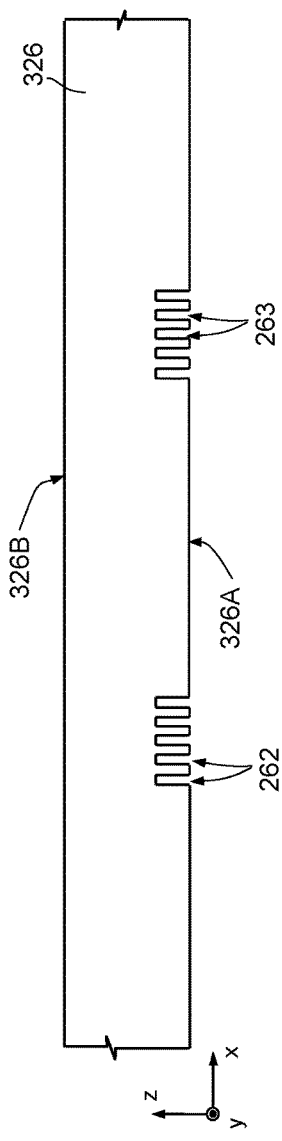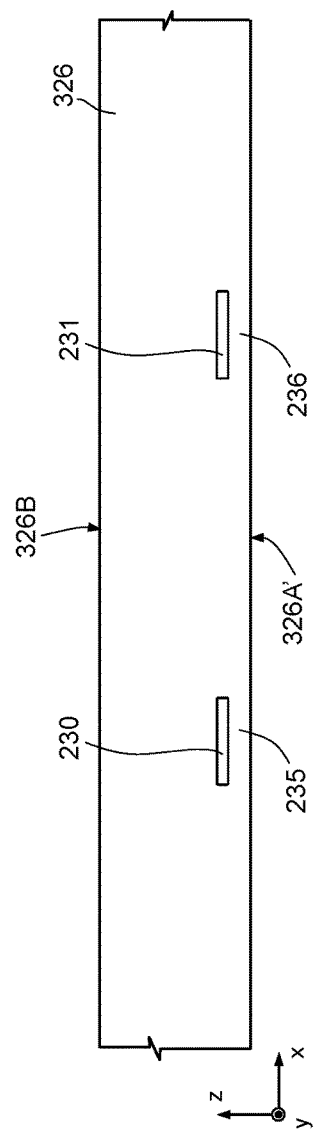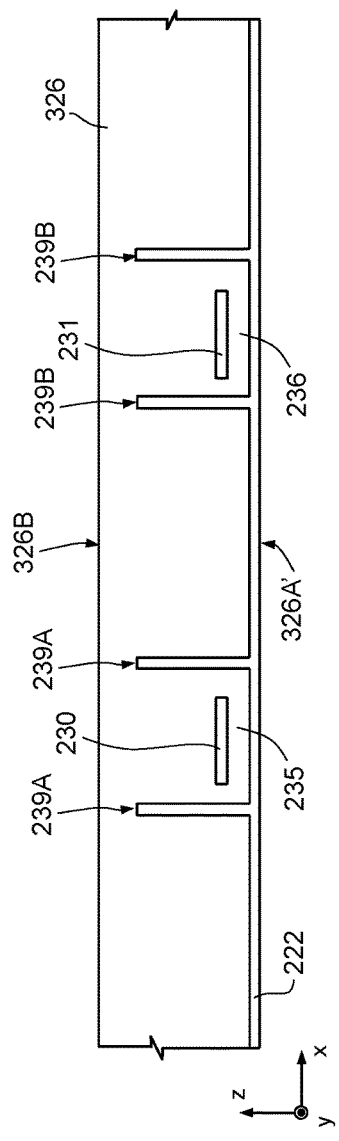

MEMS DEVICE INCLUDING A CAPACITIVE PRESSURE SENSOR AND MANUFACTURING PROCESS THEREOF

BACKGROUND

Technical Field

The present disclosure relates to a MEMS device including a capacitive pressure sensor and manufacturing process thereof.

Description of the Related Art

As is well known, micro-electro-mechanical (MEMS) devices are increasingly being used as transducers. These include a structure based on the properties of semiconductor materials to detect physical magnitudes and to generate electrical magnitudes (current or voltage) that are representative of and correlated to the physical magnitudes detected, or to generate movements in response to the application of electrical magnitudes.

Known transducers include, for example, pressure sensors, gyroscopes, accelerometers and the like. The integration of a plurality of transducers of the same type in an electronic device specifies the use of dedicated integrated-circuit boards, and therefore has a significant impact on the use of space.

Currently, it is difficult to integrate different types of transducers in a single package, while simultaneously optimizing spatial layout, surface-area use and cost.

For example, the integration of different types of sensors is increasingly desired in smart phones, multifunction watches and other wearable devices, such as pressure sensors and inertial sensors such as accelerometers and gyroscopes. However, the inclusion of such sensors in small devices is problematic since the total surface area occupied by same is too great for such devices. It is therefore desirable to create simple MEMS devices that occupy limited surface area and that are easy to integrate.

Furthermore, in general, even when integrating a single transducer in a given package, it is useful to be able to make said transducer using techniques that are easily adaptable to multiple-transducer solutions, such as to reduce design costs.

BRIEF SUMMARY

Embodiments are directed to a MEMS device that includes a capacitive pressure sensor, an electronic device including a MEMS device, and a method for manufacturing a MEMS device.

BRIEF DESCRIPTION OF THE SEVERAL VIEWS OF THE DRAWINGS

The present disclosure is further described below with reference to preferred embodiments of same, which are provided purely as non-limiting examples, and to the attached drawings, in which:

FIGS. 3-7 show successive manufacturing phases of a MEMS device when working a first wafer of semiconductor material, FIGS. 8-11 show successive manufacturing phases of the MEMS device in FIGS. 3-7 when working a second wafer of semiconductor material, FIGS. 15-19 show successive manufacturing phases of the MEMS device in FIG. 13, which are similar to those in FIGS. 8-11, when working the second wafer of semiconductor material.

DETAILED DESCRIPTION

Figure 1:
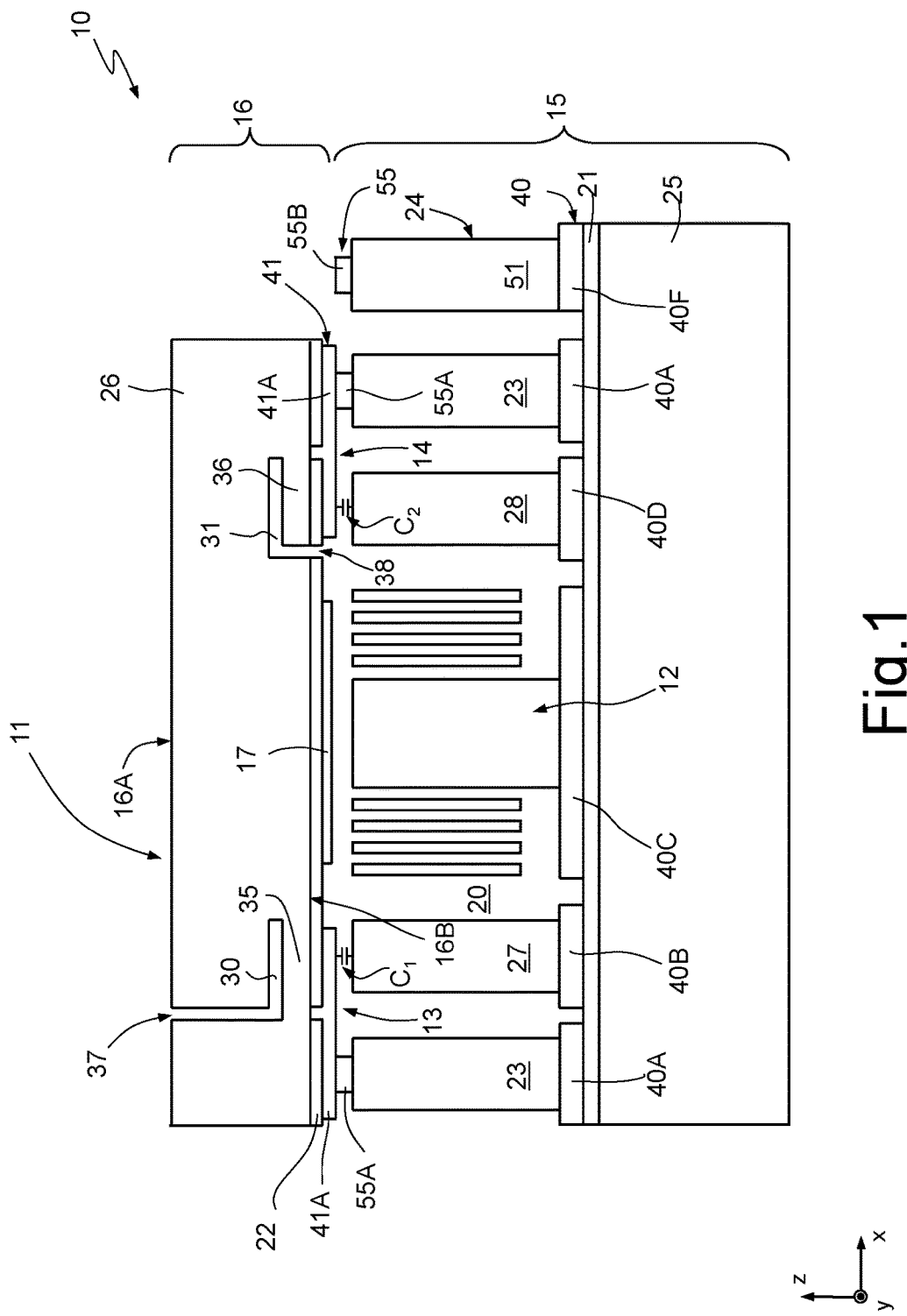
FIG. 1 is a cross section of an embodiment of the present MEMS device, taken along the line I-I in FIG. 2.

FIG. 1 shows a MEMS device 10 containing a differential pressure sensor 11 and a transducer 12, for example an inertial sensor such as an accelerometer or a gyroscope, shown schematically. The differential pressure sensor 11 in this case comprises an environmental sensor structure 13 including a first capacitor element C1, and a reference structure 14 including a second capacitor element C2.

As shown in detail in FIG. 1, the MEMS device 10 is formed by a body 15 and a cap 16 that are bonded together.

The body 15 is monolithic and formed from a first wafer of semiconductor material, and the cap 16 is monolithic and formed from a second wafer of semiconductor material.

More specifically, the body 15 comprises the following, stacked together: a substrate 25 of semiconductor material (for example single-crystal silicon), a first insulating layer 21 made of electrically insulating material such as silicon oxide ($SiO_2$), and a structural layer 24, for example epitaxially grown N-type doped polysilicon (also known as "epipoly").

The cap 16 includes a cap layer 26 of semiconductor material (for example single-crystal silicon) and a second insulating layer 22, for example silicon oxide, arranged on top of one another. The cap 16 has an outer surface 16A formed by the cap layer 26, and an inner surface 16B formed by the second insulating layer 22.

The structural layer 24 forms a wall 23 that has a closed shape when seen from above (FIG. 2) and that laterally delimits a chamber 20. The chamber 20 is also delimited below by the first insulating layer 21 and above by the second insulating layer 22.

The structural layer 24 also forms the inertial transducer 12, a first column 27 and a second column 28, all contained within the chamber 20. The first column 27 forms a first plate of the first capacitor element C1 of the environmental sensor structure 13 and the second column 28 forms a first plate of the second capacitor element C2 of the reference structure 14.

The cap 16 contains a first cavity 30 and a second cavity 31. The first cavity 30 is arranged vertically aligned with the first column 27 (in a direction parallel to an axis Z of a Cartesian coordinate system XYZ) and, together with the second insulating layer 22, delimits a portion of the cap 16 forming a first membrane 35. The first membrane 35 therefore faces the first column 27 and forms a second plate of the first capacitor element C1. Furthermore, the second cavity 31 is arranged vertically aligned with the second column 28) and, together with the second insulating layer 22, delimits a portion of the cap 16 forming a second membrane 36. The second membrane 36 therefore faces the second column 28 and forms a second plate of the second capacitor element C2.

The cap 16 also has a first channel 37 and a second channel 38. In particular, the first channel 37 extends between the outer surface 16A of the cap 16 and the first cavity 30 and fluidly connects the first cavity 30 with the external environment. The second channel 38 extends between the inner surface 16B of the cap 16 and the second cavity 31 and fluidly connects the second cavity 31 with the chamber 20.

A first electrical connection layer 40 extends between the first insulating layer 21 and the structural layer 24. In particular, the first electrical connection layer 40 forms a first connection region 40A extending beneath and connected electrically to the wall 23, a second connection region 40B extending beneath and connected electrically to the first column 27, third connection regions 40C (just one shown) extending beneath and connected electrically to the transducer 12, fourth connection regions 40D extending beneath and connected electrically to the second column 28, and fifth connection regions 40F extending beneath and connected electrically to the contact column 51. The fourth and fifth connection regions 40D, 40F connect the structures 27, 28 and the contact column 51 via conductors (not shown) arranged inside the first insulating layer 21. The connection regions 40B-40D connect the respective structures 27, 28 and 12 to the outside via conductors (not shown) arranged inside the first insulating layer 21, which may be made of multiple layers in a known manner, not illustrated in detail. Furthermore and as clearly known to the person skilled in the art, the third connection regions 40C (which are coupled electrically to the transducer 12) may include multiple regions and conductors, depending on the type of transducer made.

A contact region 55A made of a conductive material such as metal (for example gold or gold alloys, Au or Au—Sn, or aluminum-germanium alloys, Al—Ge) extends above the wall 23 around the entire perimeter of same, and as such also has a closed shape when viewed from above. A contact region 55B, made from the same material as the contact region 55A, extends above the contact column 51.

A second electrical connection layer 41 made of a conductive material such as metal (for example aluminum, Al, or gold, Au), extends beneath the second insulating layer 22 and forms a bonding and connection region 41A. The bonding and connection region 41A may have a closed shape similar to the shape of the contact region 55A (although the surface area of same is usually greater) and overlaps (in a direction parallel to the axis Z) with the contact region 55A itself, and is bonded to same. Consequently, the connection region 41A and the contact region 55A form a sealing region that insulates the chamber 20 from the outside of the device 10. The bonding and connection region 41A is also in direct contact with the first and second membranes 35, 36 via contact portions passing through the second insulating layer 22. Consequently, the membranes 35, 36 are electrically connected to the first connection region 40A via the bonding and connection region 41A and the walls 23.

Furthermore the inner surface 16B of the cap 16 may include an absorber element 17, also known as a "getter".

The absorber element 17 is used to absorb specific gas molecules inside the chamber 20 and is provided in the embodiment in which the transducer 12 is a gyroscope. The absorber element 17 may be made of metal, such as aluminum (Al), barium (Ba), zirconium (Zr), titanium (Ti), vanadium (V), iron (Fe), or mixtures or alloys of same, such as zirconium aluminum, zirconium-vanadium-iron, zirconium-nickel, zirconium-cobalt (in particular, a Zr/Co/O alloy).

In the MEMS device 10, due to the connection of the first cavity 30 with the outside, the first membrane 35 of the environmental sensor structure 13 may be deflected as a function of external pressure. Furthermore, the first membrane 35 is deflected under the effect of the pressure inside the chamber 20. The capacitive variation may be detected as a variation in the voltage across the first capacitor element C1, supplied to the outside via the connection region 40B, 40A. Conversely, the second membrane 36 of the reference structure 14 is not subjected to external pressure, but is deflected under the effect of the pressure inside the chamber 20. Furthermore, the first and second membranes 35, 36 may be deflected as a result of internal stresses inside the MEMS device 10. All of these deflections can be detected as variations in the distance between the first membrane 35 and the first column 27, as well as variations in the distance between the second membrane 36 and the second column 28. Such distance variations determine corresponding capacity variations in the first capacitor element C1 and of the second capacitor element C2. The electrical magnitude supplied by the connection regions 40A, 40B, 40D may then be supplied to an external circuit, for example a bridge circuit, via the contact column 51 to supply a compensated pressure value. In particular, the variation in charge on one of the plates of the capacitor element C1 e C2 can be measured by applying a voltage step to the other plate. The external pressure applied is obtained by subtracting the measurement taken on the second capacitor element C2 from the measurement taken on the first capacitor element C1, thereby eliminating the influence of the pressure inside the chamber 20 and stresses.

Figure 2:
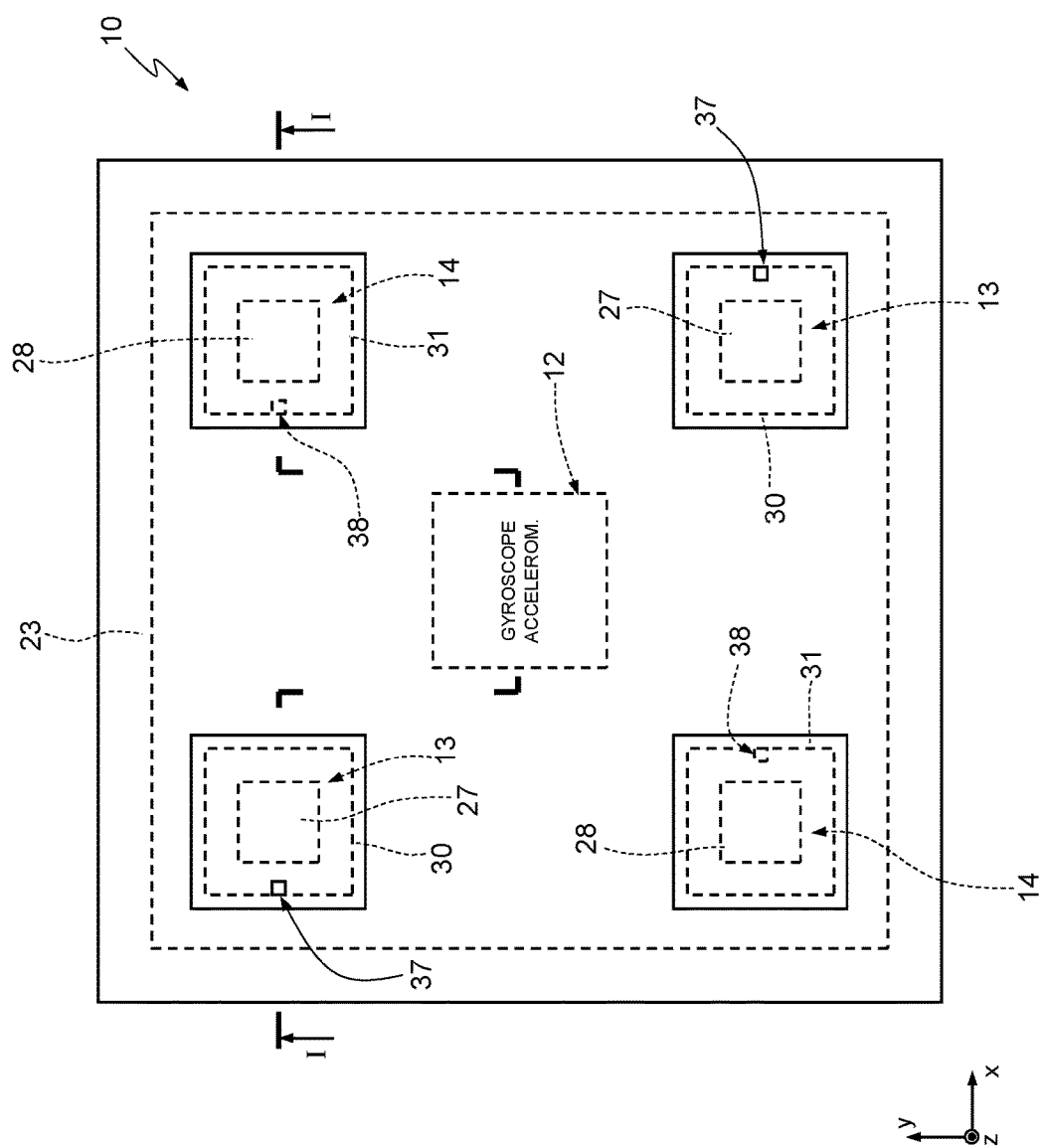
FIG. 2 is a top view of a possible implementation of the device in FIG. 1, with some transparent portions.

FIG. 2 is a top view of an embodiment of the MEMS device 10 including a pair of environmental sensor structures 13 and a pair of reference structures 14. In this figure, the cavities 30, 31, the columns 27, 28, the wall 23 and the second channels 38 are shown using dotted lines, and the first channels 37 are visible.

The manufacturing steps of the MEMS device 10 in FIG. 1 are described below with reference to FIGS. 3-11. The description below refers to the manufacture of a single device 10, although other adjacent devices are manufactured simultaneously and separated at the end of the manufacturing steps by cutting or dicing, as is known to a person skilled in the art. FIGS. 3-11 therefore show portions of the devices adjacent to the device 15, indicated using the same reference signs.

With reference to FIG. 3, a first insulating layer 21 is grown on a first wafer 115 including a substrate 125, said first insulating layer 21 covering the entire upper surface of the substrate 125. The first electrical connection layer 40, covering the entire upper surface of the first insulating layer 21, is then deposited on the upper surface of the first insulating layer 21. The first electrical connection layer 40, which is made of conductive material such as N-type polysilicon, is then shaped using known masking and etching techniques to form the connection regions 40A-40F.

As shown in FIG. 4, a layer of silicon nitride (not shown) is deposited and shaped using known deposition and shaping techniques. More specifically, the layer of silicon nitride is used as an etch stop for the subsequent release step of the structures of the transducer 12.

A sacrificial layer 50, usually made of silicon oxide, is then deposited on the layer of silicon nitride, and said sacrificial layer 50 is defined to form a plurality of sacrificial regions 50A-50B.

As shown in FIG. 5, the structural layer 24 is grown epitaxially on the sacrificial layer 50 and on the connection regions 40A-40F. Subsequently and as shown in FIG. 6, the structural layer 24 is shaped using known masking and etching techniques to define the transducer 12 (of which an anchoring column 53 and a plurality of suspended electrodes 60 are shown) and to form the first and second columns 27, 28 and the walls 23. Furthermore, the contact column 51 is also defined in this step, said column being arranged outside the area defined by the wall 23.

The structural layer 24 is planarized, for example using the chemical mechanical polishing (CMP) technique to provide a compact layer and with a low-roughness upper surface.

The metal layer 55 is deposited by sputtering on the upper surface of the structural layer 24. This metal layer 55 is defined using appropriate lithography and etching techniques to form the contact region 55A and the contact region 55B above the contact column 51.

As shown in FIG. 7, the sacrificial regions 50A-50B are removed using known removal techniques to release the suspended structures of the transducer 12, in particular the suspended electrodes 60.

FIGS. 8-11 refer to the phases for working a second wafer 126 of semiconductor material, for example silicon, to make the cap 16.

As shown in FIG. 8, the second wafer 126, which has first and second surfaces 126A, 126B, is worked using known masking and etching techniques, for example using chemical anisotropic etching, to form a plurality of trenches 62, 63 extending from the first surface 126A of the second wafer 126.

In particular, the trenches 62, 63 are positioned to coincide with the areas of the second wafer 126 designed to receive the cavities 30, 31 in FIG. 1. A thermal treatment step ("annealing") is performed with known time and temperature settings, for example for 30 minutes at 1190° C. This annealing step causes a migration of the silicon atoms, which tend to move towards lower energy positions, forming the cavities 30, 31 in FIG. 9. An epitaxial growth step is carried out on the main surface 126A of the second wafer 126, which is marked in the figure using reference sign 126A'. With reference to FIG. 9, membranes 35, 36 are then formed beneath the cavities 30, 31.

As shown in FIG. 10, known deposition techniques (for example "sputtering") are used to deposit the second electrical connection layer 41 on the first surface 126A' of the second wafer 126. The second electrical connection layer 41 is defined in a known manner such as to form the bonding and connection region 41A.

Before or after the bonding and connection region 41A is formed, the second channel 38 is made in the second wafer 126. The second channel 38 is formed from the first surface 126A', for example using anisotropic etching techniques. The second channel 38 is deep enough to reach the cavity 31.

Subsequently and as shown in FIG. 11, a thinning step for the second wafer 126 may be carried out. This step is for example performed using a grinding process on the second surface 126B of the second wafer 126. The new second surface is indicated in FIG. 11 using reference sign 126B'.

The first channel 37 is made from the second surface 126B'. In particular, the first channel 37 is made using known masking and etching techniques until the cavity 30 is reached, bringing said cavity into communication with the outside of the second wafer 126.

Subsequently or before thinning of the second wafer 126, the absorber element 17 may be deposited on the first surface 126A' of same using known deposition techniques.

Figure 12:
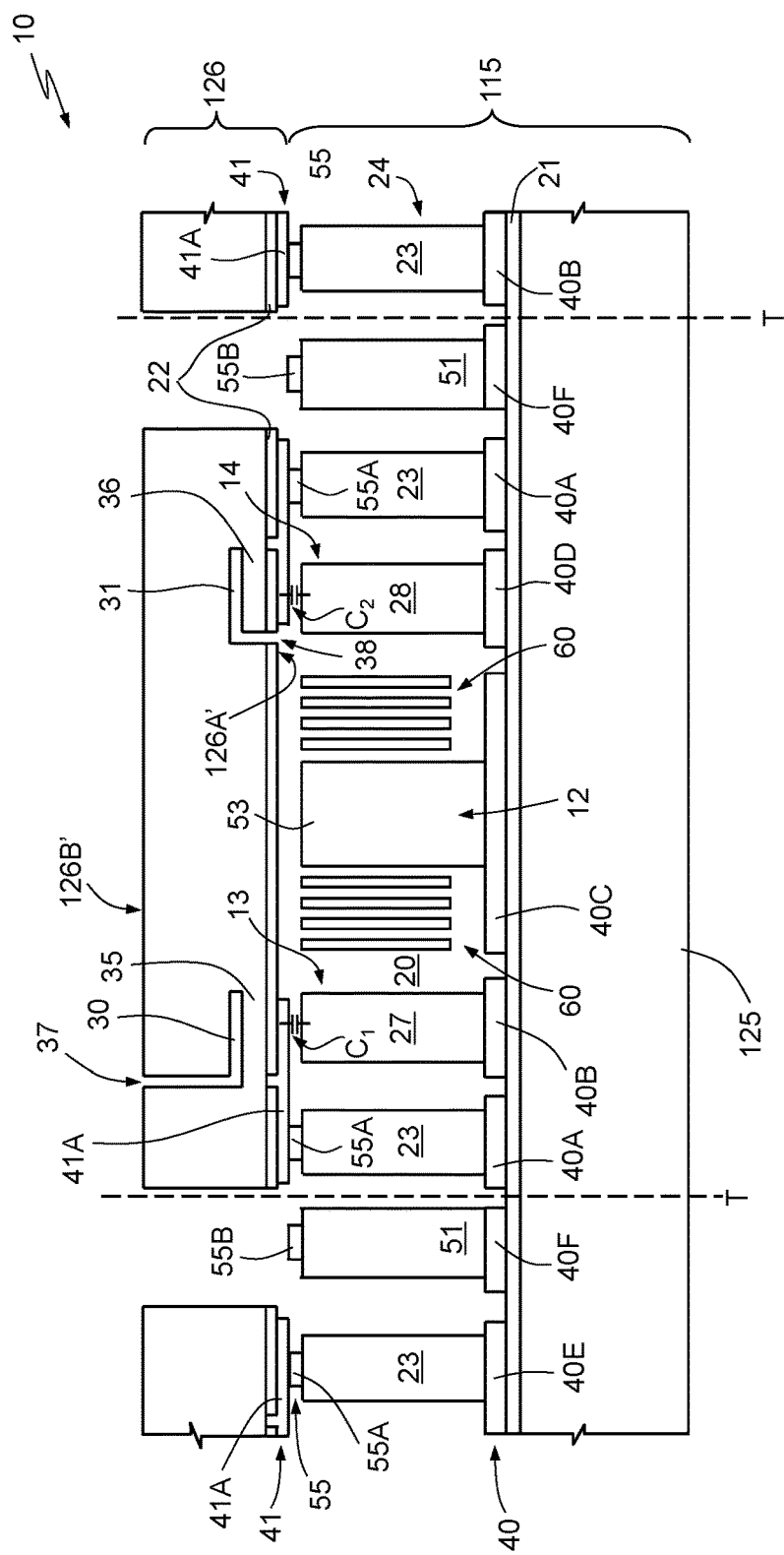
FIG. 12 is a cross section of the MEMS device in FIGS. 3-11 after the first and second wafers have been bonded.

As shown in FIG. 12, the first wafer 115 and the second wafer 126 are bonded together with the first surface 126A' of the second wafer 126 oriented towards the transducer 12 and the structures 23, 27, 28.

The first wafer 115 and the second wafer 126 are coupled together using known welding or bonding techniques, for example. In the example shown, the first wafer 115 and the second wafer 126 are couple together by metal connection between the contact regions 55A and the bonding and connection region 41A.

The portion of the second wafer 126 above the contact column 51 is removed using known masking and etching techniques to form through openings in the second wafer. Consequently, the contact column 51 is accessible from the outside of the MEMS device and can be used to connect the MEMS device 10 (FIG. 12) with the external environment or other devices, such as an application-specific integrated circuit (ASIC). In other embodiments, the through openings in the second wafer may be formed prior to bonding together the second wafer and the first wafer.

In particular, the contact column 51 enables the membranes 35, 36 to be biased. Similar contact columns (not shown) enable other regions of the MEMS device 10 to be biased, including the columns 27, 28 and the transducer 12.

The composite wafer in FIG. 12 is diced along cutting lines T shown using dotted lines in FIG. 12 to make a plurality of MEMS devices 10, as shown in FIG. 1.

Figure 13:
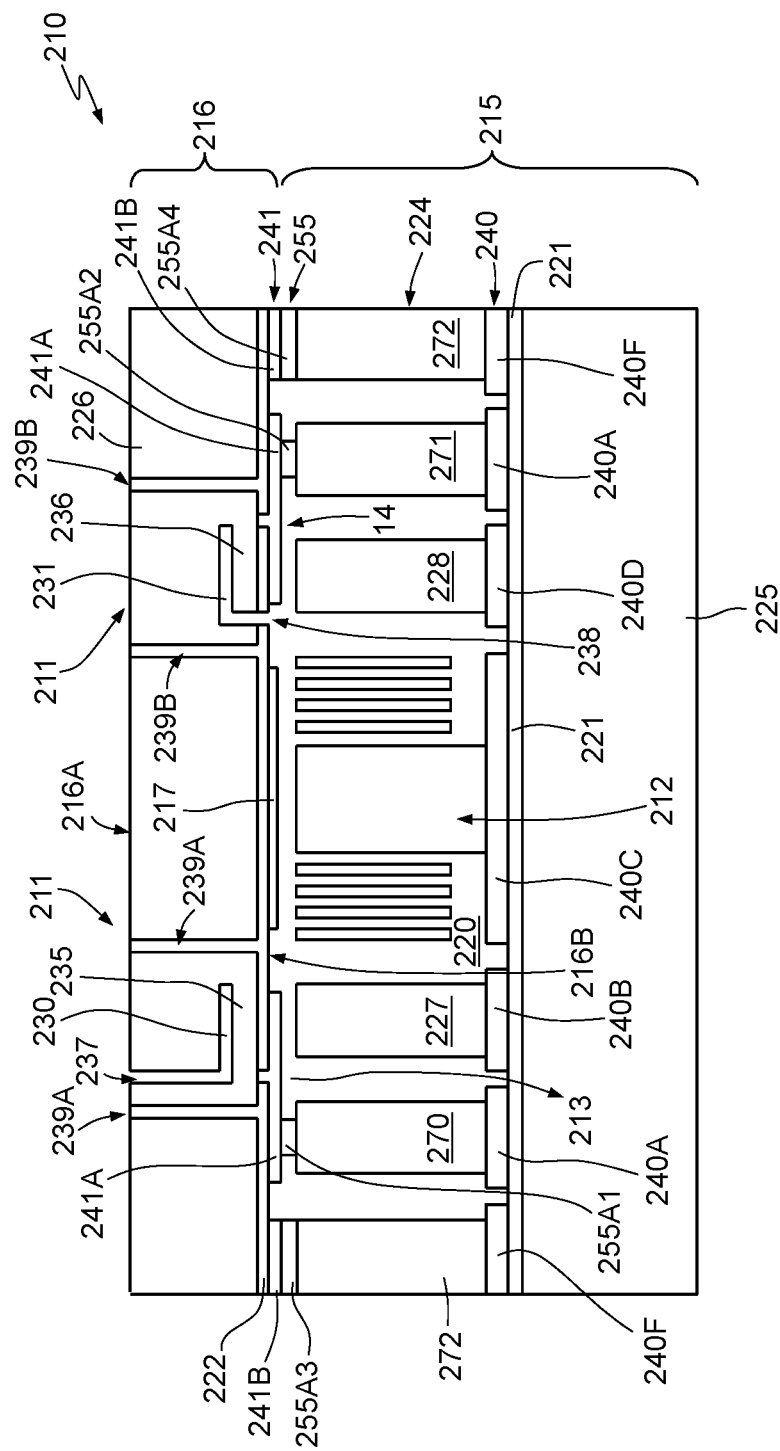
FIG. 13 is a cross section of a different embodiment of the present MEMS device, taken along the line XIII-XIII in FIG. 14.

FIG. 13 shows a MEMS device 210 according to a different embodiment. The MEMS device 210 is similar to the MEMS device 10 in FIG. 1 except as described below. Consequently, the parts of the MEMS device 210 that are similar to the parts of the MEMS device 10 have been indicated using reference signs increased by 200, and are not further discussed here.

The structural layer 224 in this case forms first and second biasing columns 270, 271, in addition to the columns 227, 228 and the transducer 212. The structural layer 224 also forms a wall 272 that is closed when seen from above (FIG. 14) and that laterally delimits the chamber 220.

In this embodiment, the cap 216 as a plurality of trenches 239 extending through the entire thickness of the cap 216 and are filled with insulating material. In particular and as shown in FIG. 13, a first trench 239A surrounds the portion of the cap 216 containing the first cavity 230, the first membrane 235 and the first channel 237. A second trench 239B surrounds the portion of the cap 216 containing the second cavity, 231, the second membrane 236 and the second channel 238. Consequently, the portions of the cap 216 containing the membranes 235, 236, the cavities 230, 231 and the channels 237, 238 are separated electrically from the rest of the cap 216.

In this case, the first electrical connection layer 240, in addition to the connection regions 240A-240D, forms fifth connection regions 240F extending beneath and electrically connected to the wall 272. Furthermore, in this case the first connection regions 240A connect the respective columns 270, 271 to the outside via conductors (not shown) arranged inside the first insulating layer 221.

Contact regions 255A1, 255A2 made of conductive material such as metal extend above the columns 270, 271 to connect same electrically to the respective membranes 235, 236 through connection regions 241A.

Furthermore, the wall 272 is bonded to the cap 216 via a connection region 241B, made for example from the same material as the connection region 241A, and a contact region 255A3, made for example from the same material as the contact regions 255A1, 255A2, such as to sealingly close the chamber 220.

Figure 14:
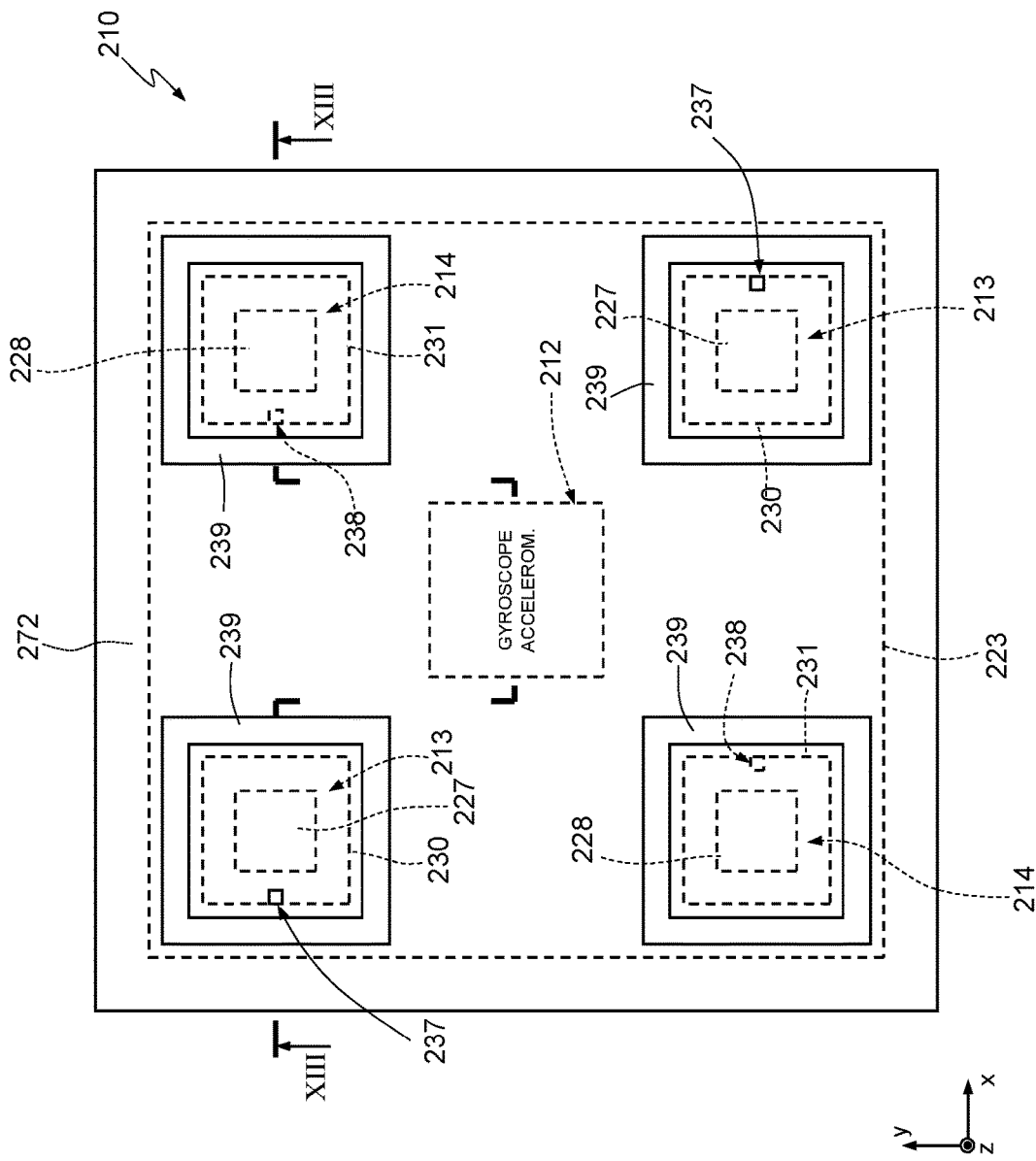
FIG. 14 is a top view of a possible implementation of the device in FIG. 13, with some transparent portions.

FIG. 14 is a top view of an embodiment of the MEMS device 210 including a pair of environmental sensor structures 213 and a pair of reference structures 214. In this figure, the cavities 230, 231, the columns 227, 228, the wall 272 and the second channels 238 are shown using dotted lines, and the first channels 237 and the trenches 239 are visible.

The manufacturing steps for the MEMS device 210 in FIG. 13 are described below with reference only to formation of the cap 216, since the manufacturing steps for the wafer 215 are similar to the manufacturing phases shown in FIGS. 3-7 and differ only in that the columns 270, 271 are defined during the shaping phase of the structural layer 224.

With reference to FIG. 15, the second wafer 326 is worked to form the trenches 262, 263. Similarly to FIG. 9, a thermal treatment step ("annealing"), FIG. 16 and an epitaxial growth step are then performed.

Subsequently and as shown in FIG. 17, known anisotropic etching techniques are used to form the trenches 239 and known deposition techniques are used to deposit the second insulating layer 222. The second insulating layer 222 completely fills the trench 239 and covers the main surface 326A' of the second wafer 326. In particular, the second insulating layer 222 is made of a dielectric material, such as silicon oxide (SiO$_2$).

Figure 18:
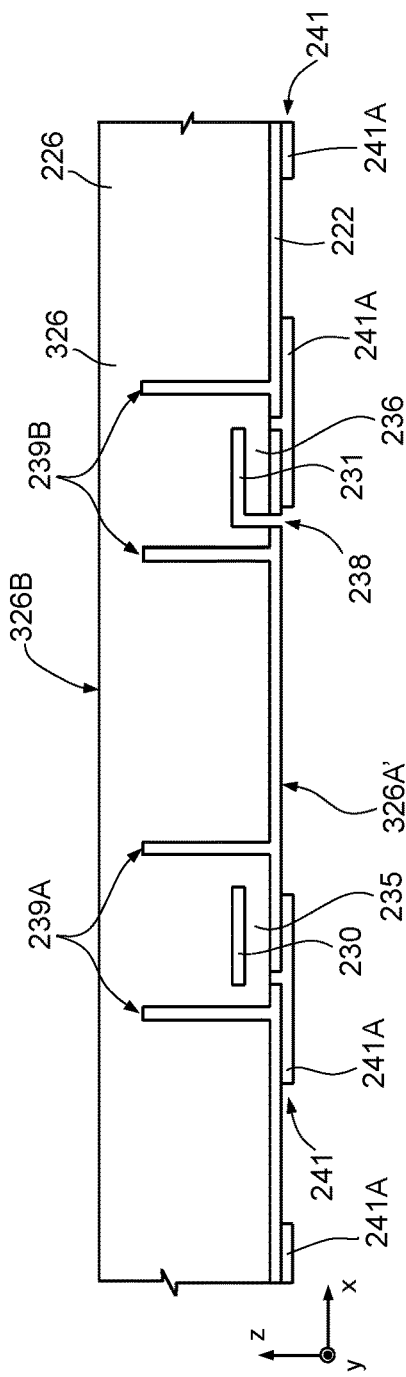

Subsequently and as shown in FIG. 18, the second electrical connection layer 241 is deposited and the second channel 238 is formed, similarly to that described with reference to FIG. 10.

Figure 19:
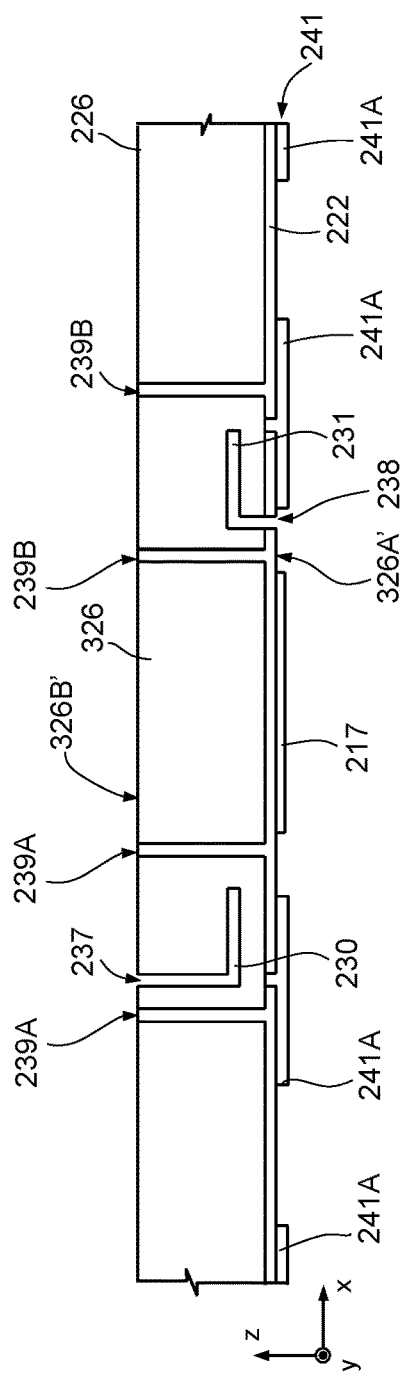

Subsequently and as shown in FIG. 19, the second wafer 326 is thinned. This step is for example performed using a grinding process on the second surface 326B of the second wafer 326. The new second surface is then indicated in FIG. 19 using reference sign 326B'. In particular, the grinding process enables material to be removed from the second wafer 326 until the trench 239 is exposed.

The subsequent steps are similar to those described with reference to FIGS. 11 and 12, including the formation of the first channel 237, the potential depositing of the absorber element 217, bonding of the second wafer 216 to the first wafer (not shown here) and cutting of the composite wafer.

Figure 20:
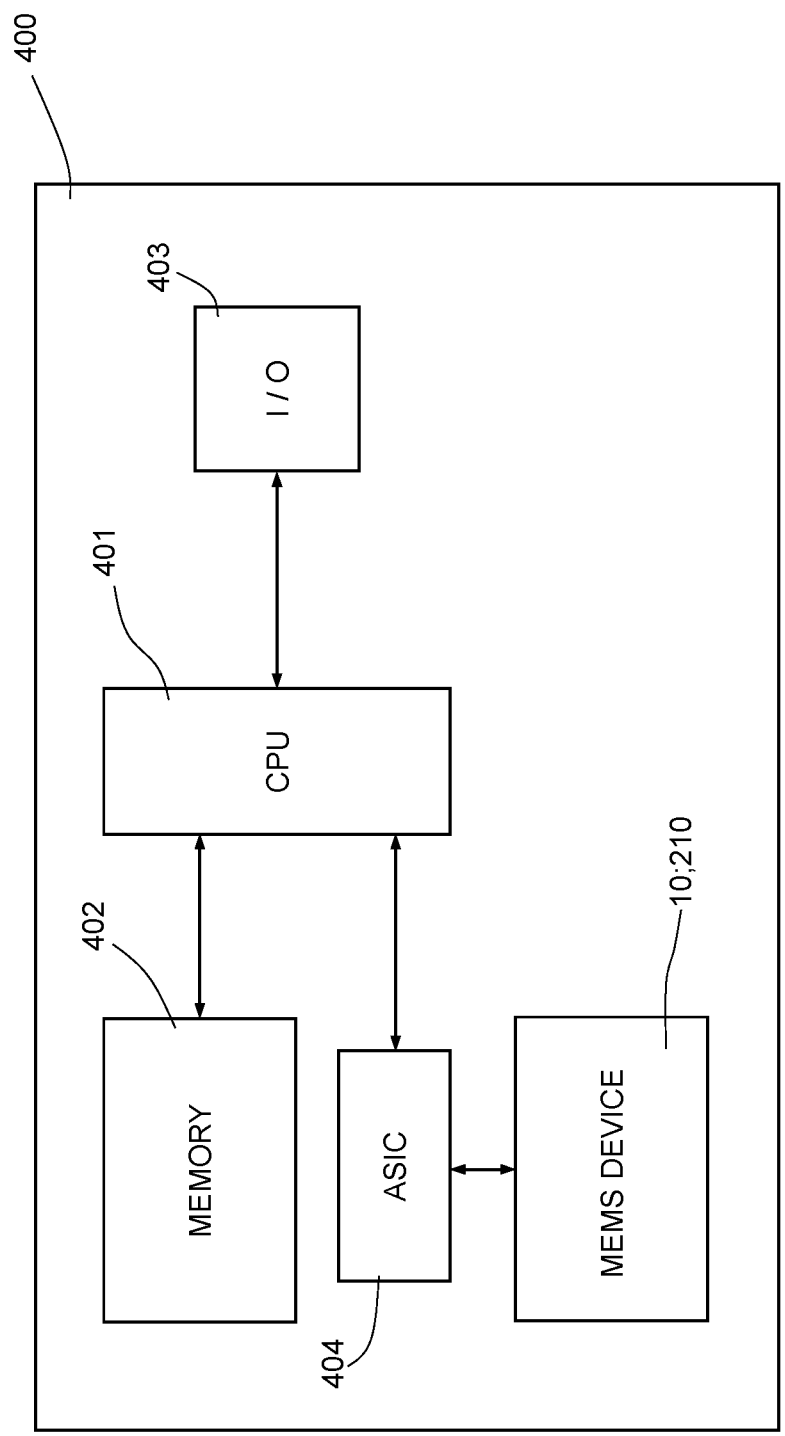
FIG. 20 is a schematic view of an electronic device including the present MEMS device.

FIG. 20 shows an electronic device 400 that uses the MEMS device 10; 210 described above.

The electronic device 400, in addition to the MEMS device 10; 210, includes a microprocessor (CPU) 401, a memory block 402 connected to the microprocessor 401, and an input/output interface 403, for example a keyboard and/or a video, also connected to the microprocessor 401. An application-specific integrated circuit (ASIC) 404 may also be built into the MEMS device 10; 210 or, as shown in FIG. 20, arranged outside the MEMS device 10; 210 and coupled operationally to same.

The MEMS device 10; 210 communicates with the microprocessor 401 via the application-specific integrated circuit (ASIC) 404.

The electronic device 400 is for example a mobile communication device, for example a cell phone or smart phone, a personal digital assistant (PDA), or a processor (computer), but may also be a voice recorder, an audio file reader with voice recording capacity, a wearable device, such as a smart watch, a video game console, etc.

The advantages of the device described are clear from the description above.

In particular, the present MEMS device is easy to manufacture and provides a pressure sensor in the cap. With the solution shown, it is for example possible to make a differential pressure sensor with trenches extending from two opposing surfaces of a single wafer, thereby minimizing the space required for integration and reducing manufacturing costs. The device can be adapted to different layouts as desired, and is easy to integrate into different devices, maximizing the sharing of structures between components.

The presence of the differential pressure sensor in the same chamber as the gyroscope can be useful for detecting a loss of seal in the chamber (if the internal pressure is the same as the external pressure).

It is evident that modifications and variations may be made to the device and method described and illustrated without thereby moving outside the scope of protection of the present disclosure.

In particular, the device may have different transducers, for example an accelerometer may be provided instead of a gyroscope. Furthermore, the geometric shape of the component parts may be varied.

Finally, the first and second wafers 115, 126 may be bonded using different techniques, for example by eutectic bonding between the bonding and connection region 41A and the wall 23 made of semiconductor material.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device comprising:
a layer of semiconductor material, the layer of semiconductor material forming a chamber and including a first column in the chamber; and
a cap of semiconductor material having a first face and a second face, the first face of the cap coupled to the layer of semiconductor material and covering the chamber and the first column, the cap including a first membrane delimited by a first cavity in the cap and the first face, the cap further including a first channel extending between the second face and the first cavity or between the first face and the first cavity,
wherein the first column faces the first membrane, and wherein the first column and the membrane forming plates of a first capacitor element of a capacitive pressure sensor.

2. A MEMS device comprising:
a body of semiconductor material, the body of semiconductor material having a chamber and including a first column in the chamber;
a cap of semiconductor material having a first face and a second face, the first face of the cap coupled to the body and covering the chamber and the first column, the cap including a first membrane delimited by a first cavity in the cap and the first face, the cap further including a first channel extending between the second face and the first cavity or between the first face and the first cavity,
wherein the first column faces the first membrane, and wherein the first column and the membrane forming plates of a first capacitor element of a capacitive pressure sensor, wherein the first channel extends between the first face and the first cavity; and a second membrane, a second cavity, a second channel and a second column, the second membrane being arranged between the second cavity and the second face, the second channel extending between the second face and the second cavity, the second column being inside the chamber and extending towards the second membrane and forming with the second membrane plates of a second capacitor element.

3. The MEMS device according to claim 2, wherein the first capacitor element is an environmental sensor capacitor and the second capacitor element is a reference capacitor.

4. The MEMS device according to claim 1, wherein the layer of semiconductor material includes an inertial transducer that is located inside the chamber.

5. The MEMS device according to claim 1, wherein the layer of semiconductor material includes a wall surrounding the chamber, the wall being coupled to the first face of the cap.

6. The MEMS device according to claim 5, further comprising an electrically conductive region located on the first face of the cap, the electrically conductive region electrically coupled to the first membrane and the wall.

7. The MEMS device according to claim 6, wherein the electrically conductive region is in direct contact with the first membrane and in contact with the wall by a metal contact region.

8. The MEMS device according to claim 5, further comprising an electrically conductive region and a third column of semiconductor material extending inside the chamber, the third column being electrically coupled to the first membrane by the electrically conductive region.

9. The MEMS device according to claim 8, wherein the cap has at least one through trench surrounding and electrically insulating the first membrane, the first cavity and the first channel from remaining portions of the cap.

10. The MEMS device according to claim 5, wherein the layer of semiconductor material is coupled to a substrate, the substrate supporting the wall and the first column, the MEMS device further including an electrical connection structure having a first portion that extends between the substrate and the first column and a second portion extending outside the wall.

11. The MEMS device according to claim 10, wherein the structural layer includes a contact column that is outward of the wall and external from the chamber, the contact column being in electrical contact with the second portion of the connection structure.

12. A method comprising:
in a first semiconductor wafer, forming a first die, wherein forming the first die includes forming a semiconductor layer, the semiconductor layer including a chamber and a first column in the chamber;
in a second semiconductor wafer, forming a second semiconductor die, wherein forming the second die includes:
forming a first buried cavity;
forming a first membrane between the first buried cavity and a first surface of the second die, the first membrane being of semiconductor material; and
forming a first channel, wherein forming the first channel extends between the first buried cavity and the first surface of the second die or between the first buried cavity and a second surface of the second die; and coupling the first die and second die together such that the first column of the first die faces the first membrane of the second die and forms, with the first membrane, plates of a first capacitor element.

13. The method according to claim 12, wherein forming the first channel includes selectively removing portions of the second surface of the second die, the method further including:
forming a second column in the chamber;
forming a second buried cavity in the second die;
forming a second membrane of semiconductor material between the second buried cavity and the first surface of the second die, and
forming, in the second die, a second channel extending between the second buried cavity and the first surface of the second die.

14. The method according to claim 13, further comprising forming an inertial transducer while forming the chamber, the first column, and the second column.

15. A method comprising:
in a first semiconductor wafer, forming a first die, wherein forming the first die includes forming a chamber and forming a first column and a second column in the chamber, wherein forming the chamber and forming the first column and the second column includes:
forming a first insulating layer on a surface of the first die,
forming connection regions of electrically conductive material on the first insulating layer,
epitaxially growing a structural layer of semiconductor material on the connection regions, and
etching the structural layer to form the chamber and to form the first column and the second column,
in a second semiconductor wafer, forming a second semiconductor die, wherein forming the second die includes:
forming first and second buried cavities;
forming a first membrane between the first buried cavity and a first surface of the second die, the first membrane being of semiconductor material;
forming a second membrane between the first buried cavity and the first surface of the second die, the second membrane being of semiconductor material;
forming a first channel, wherein forming the first channel includes selectively removing portions of a second surface of the second die, wherein the first channel extends between the first buried cavity and the second surface of the second die; and
forming a second channel extending between the second buried cavity and the first surface of the second die; and
coupling the first die and second die together such that the first column of the first die faces the first membrane of the second die and forms, with the first membrane, plates of a first capacitor element and the second column of the first die faces the second membrane of the second die and forms, with the second membrane, plates of a second capacitor element.

16. The method according to claim 13, wherein forming the first buried cavity and the second buried cavity and forming the first membrane and the second membrane includes:
forming trenches at the first surface of the second die,
thermally treating the second wafer, and
epitaxially growing a layer of semiconductor material on the first surface of the second die.

17. The method according to claim 13, further comprising:
- forming a wall surrounding the chamber, simultaneously with, forming the chamber, forming a first column and forming a second column, and
- before coupling the first die and second die together, forming, on the first surface of the second die, bonding and connection regions in electrical contact with the first membrane and the second membrane,
- wherein coupling the first die and second die together comprises coupling the bonding and connection regions to the wall.

18. The method according to claim 13, further comprising:
- forming a wall surrounding the chamber, simultaneously with, forming first, second, third and fourth columns; and
- before coupling the first die and second die together, forming, on the first surface of the second die, connection regions in electrical contact with the first membrane and the second membrane,
- wherein coupling the first die and second die together comprises coupling the second die to the wall.

19. The method according to claim 18, further comprising after forming the first cavity and the second cavity and forming the first membrane and the second membrane, selectively removing portions of the second die to form a plurality of trenches extending from the first surface of the second die and surrounding the first membrane and the second membrane respectively, filling the trenches with dialectic material, and thinning the second wafer from the second surface as far as the trenches.

20. An electronic device comprising:
an ASIC; and
MEMS device coupled to the ASIC, the MEMS device including:
- a first body having a first surface and a second surface, the first body including a layer of semiconductor material, the layer of semiconductor material forming a chamber and a first column in the chamber; and
- a second body having a first surface and a second surface, the second body including semiconductor material, the first surface of the second body coupled to first surface of the first body and covering the chamber, the second body including a first cavity that forms a first membrane at the first surface, the second body including a first channel extending from the first cavity to either the first surface or the second surface of the second body, the first membrane facing the first column and together forming plates of a first capacitor.

21. The electronic device according to claim 20, wherein the first channel of the MEMS device extends from the first cavity to the first surface of the second body and places the first cavity in fluid communication with the chamber of the first body, the second body including a second cavity that forms a second membrane at the first surface of the second body and including a second channel that extends from the second cavity to the second surface of the second body and places the second cavity in fluid communication with an environment outside of the MEMS device, the second membrane facing a second column and together forming plates of a second capacitor.

22. The electronic device according to claim 20, wherein the first body of the MEMS device includes an inertial sensor in the chamber.

23. The electronic device according to claim 20, wherein the electronic device is at least one of a mobile communication device, a cell phone, a smart phone, a PDA, a computer a voice recorder, an audio file reader, a wearable device, a smart watch, or a video game console.

24. The method according to claim 15, further comprising forming an inertial transducer while forming the chamber, the first column, and the second column.

* * * * *